United States Patent
Hong et al.

(10) Patent No.: US 7,639,456 B2
(45) Date of Patent: Dec. 29, 2009

(54) DOUBLE MILL PROCESS FOR PATTERNING CURRENT PERPENDICULAR TO PLANE (CPP) MAGNETORESISTIVE DEVICES TO MINIMIZE BARRIER SHORTING AND BARRIER DAMAGE

(75) Inventors: Ying Hong, Morgan HIll, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 388 days.

(21) Appl. No.: 11/246,720

(22) Filed: Oct. 6, 2005

(65) Prior Publication Data

US 2007/0081279 A1    Apr. 12, 2007

(51) Int. Cl.
*G11B 5/39* (2006.01)
(52) U.S. Cl. .................................................. 360/324.1
(58) Field of Classification Search ............... 360/324.1
See application file for complete search history.

(56) References Cited

U.S. PATENT DOCUMENTS

| | | | |
|---|---|---|---|
| 5,650,958 A | 7/1997 | Gallagher et al. | 365/173 |
| 5,668,688 A * | 9/1997 | Dykes et al. | 360/324.1 |
| 6,466,418 B1 * | 10/2002 | Horng et al. | 360/324.12 |
| 6,600,637 B1 | 7/2003 | Wang et al. | 360/324 |
| 6,624,987 B1 | 9/2003 | Hayashi et al. | 360/324.2 |
| 6,680,832 B2 | 1/2004 | Fontana, Jr. et al. | 360/324.2 |
| 7,161,773 B2 * | 1/2007 | Fontana et al. | 360/324.1 |
| 7,180,716 B2 * | 2/2007 | Li et al. | 360/324.12 |
| 2002/0024775 A1 * | 2/2002 | Hasegawa | 360/314 |
| 2002/0135950 A1 | 9/2002 | Zhang et al. | 360/324.2 |
| 2003/0203238 A1 * | 10/2003 | Saito | 428/694 R |
| 2004/0008452 A1 | 1/2004 | Kagami et al. | 360/318 |
| 2006/0092582 A1 * | 5/2006 | Gill et al. | 360/324.12 |
| 2007/0019340 A1 * | 1/2007 | Gill | 360/324.11 |
| 2007/0035888 A1 * | 2/2007 | Sbiaa et al. | 360/324.1 |
| 2007/0035891 A1 * | 2/2007 | Freitag et al. | 360/324.11 |
| 2007/0127167 A1 * | 6/2007 | Freitag et al. | 360/324.11 |

FOREIGN PATENT DOCUMENTS

| | | |
|---|---|---|
| JP | 2003101103 | 4/2003 |
| JP | 2003298150 | 10/2003 |
| JP | 2004179250 | 6/2004 |

OTHER PUBLICATIONS

Chinese Office Action Summary from application No. 2006/10131732.X Issued on Oct. 10, 2008.

* cited by examiner

*Primary Examiner*—Mark Blouin
(74) *Attorney, Agent, or Firm*—Zilka-Kotab, PC

(57) ABSTRACT

A current perpendicular to plane (CPP) sensor and method of manufacturing such a sensor that prevents current shunting at the sides of the barrier/spacer layer due to redeposited material. A first ion mill is performed to remove at least the free layer. A quick glancing ion mill can be performed to remove the small amount of redep that may have accumulated on the sides of the free layer and barrier/spacer layer. Then an insulation layer is deposited to protect the sides of the free layer/barrier layer during subsequent manufacturing which can include further ion milling to define the rest of the sensor and another glancing ion mill to remove the redep formed by the further ion milling. This results in a sensor having no current shunting at the sides of the sensor and having no damage to the sensor layers.

14 Claims, 14 Drawing Sheets

DOUBLE MILL PROCESS FOR PATTERNING CURRENT PERPENDICULAR TO PLANE (CPP) MAGNETORESISTIVE DEVICES TO MINIMIZE BARRIER SHORTING AND BARRIER DAMAGE

FIELD OF THE INVENTION

The present invention relates to magnetoresistive sensors and more particularly to the fabrication of a current perpendicular to plane (CPP) magnetoresistive sensors.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of anti ferromagnetic material such as PtMn. While an antiferromagnetic (AFM) material such as PtMn does not in and of itself have a magnetization, when exchange coupled with a magnetic material, it can strongly pin the magnetization of the ferromagnetic layer. With the ever increasing demand for improved data rate and data capacity, engineers and scientists have been under constant pressure to develop ever smaller magnetoresistive sensors. The various dimensions of a sensor scale together, so as the track width of a sensor decreases, the gap thickness and stripe height decrease accordingly.

With the drive for ever increased data rate and data density, researchers have focused their efforts on the development of current perpendicular to plane (CPP) magnetoresistive sensors such as CPP GMR sensors and tunnel valves. Such sensors, especially tunnel valves, have the potential to provide greatly increased sensor performance such as increased dR/R, decreased gap thickness (ie. bit length), and provide an improved ability to read signals from high coercivity media such as those used in perpendicular recording systems. Perpendicular recording systems are viewed as the future of magnetic recording, because of their ability to record much smaller bits of data than is possible using more traditional longitudinal recording systems.

CPP GMR sensors operate based on spin dependent scattering of electrons, similar to a more traditional current in plane (CIP) sensor. However, in a CPP sensor, current flows from the top to the bottom of the sensor in a direction perpendicular to the plane of the sensor. A tunnel valve, or tunnel junction sensor operates based on the spin dependent tunneling of electrons through a very thin, non-magnetic, electrically insulating barrier layer. A challenge that has prevented the commercialization of CPP GMR sensors, and tunnel valves, has been the shunting of current across the sensor. This is especially problematic for tunnel valves which rely on the high resistance of the barrier layer.

A method that has been used to construct magnetoresistive sensors involves depositing the sensor layers (eg. pinned layer spacer/barrier layer, free layer) as full film layers, and then forming a mask structure over the layers. The mask structure may include a non-photoreactive layer such as DURAMIDE®, and a photoresist layer formed over the DURAMIDE®. The photoresist layer is then patterned to have a width to define the sensor track width and stripe height (back edge). If a non-photoreactive intermediary layer is present, the pattern from the photoreactive layer has to be transferred to this non-photoreactive layer using a method such as reactive ion etching. With the mask in place a material removal process is performed to remove sensor material not covered by the mask. Usually two separate masking and milling processes are performed, one to define the stripe height and another to define the track width.

As a bi-product of the milling operation, material that has been removed during milling becomes re-deposited on the sides and back of the sensor. This re-deposited material has been referred to in the industry as "redep". Such redep is undesirable in a CIP sensor because it increases parasitic resistance at the sides of the sensor and degrades free layer biasing. However, this redep is absolutely catastrophic in a CPP sensor such as a CPP GMR or a tunnel valve, because it allows sense current to be shunted through the redep, completely bypassing the active area of the sensor.

A process for removing the redep includes ion milling at a sharp, glancing angle to selectively remove material from the sides of the senor. However, this high angle ion milling causes damage to the sensor material such as by causing interlayer diffusion, resulting in a serious loss of sensor performance.

Therefore, there is a strong felt need for a method for manufacturing a magnetoresistive sensor that prevents all current shunting at the sides of the sensor. Such a method and structure would also preferably prevent damage to the sides of the sensor layer due to ion milling operations used to define the sensor.

SUMMARY OF THE INVENTION

The present invention provides a CPP magnetoresistive sensor having no redep related current shunting and having damage free sensor layers. The sensor is manufacturing by a method that minimizes the amount of redep that must be removed from the free layer and barrier/spacer layer and then protects the free layer and the barrier/spacer layer during further milling processes.

A plurality of sensor layers are deposited including a first magnetic layer which can be a pinned layer structure, a non-magnetic barrier or spacer layer formed on the first magnetic layer and a second magnetic layer which can be a free layer formed on top of the non-magnetic barrier/spacer layer. A first ion mill is performed to a level that within or just beneath the non-magnetic barrier/spacer layer. Then a second clean up ion mill may be performed to remove the small amount of redep that may have deposited as a result of the first ion mill. This second ion mill may be performed at a glancing angle with respect to the sensor layers. A layer of insulating material is then deposited to protect the sides of the second magnetic layer (free layer) and barrier/spacer layer. With the insulation layer deposited, a third ion mill is performed to define the rest of the sensor by removing the pinned layer and all or a portion of an underlying AFM layer if such an AFM layer is present.

A fourth ion mill may be performed at a glancing angle to remove any redeposited material resulting from the third ion mill and then another insulation layer can be deposited. The resulting sensor has a side formed with a step or notch at the point where the first ion mill was terminated (ie. just beneath the barrier/spacer). Both the first and second insulation layers cover the sides of the sensor above the step, whereas only the second insulation layer covers the sides below the notch.

The invention advantageously eliminates redep related shunting across the barrier/spacer layer by requiring the removal of only a minimal amount of redep from the sides of the free layer and barrier spacer layer before the first insulation layer is deposited. The first insulation layer, then, protects the sides of the free and barrier layers during the further ion milling that is performed to completely define the sensor and remove further redep. Therefore, the insulation layer prevents damage to the free layer and barrier/spacer layer such as by preventing interlayer diffusion at the sides of the sensor. The insulation layer also prevents any further redep from contacting the sides of the free layer and barrier layer.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
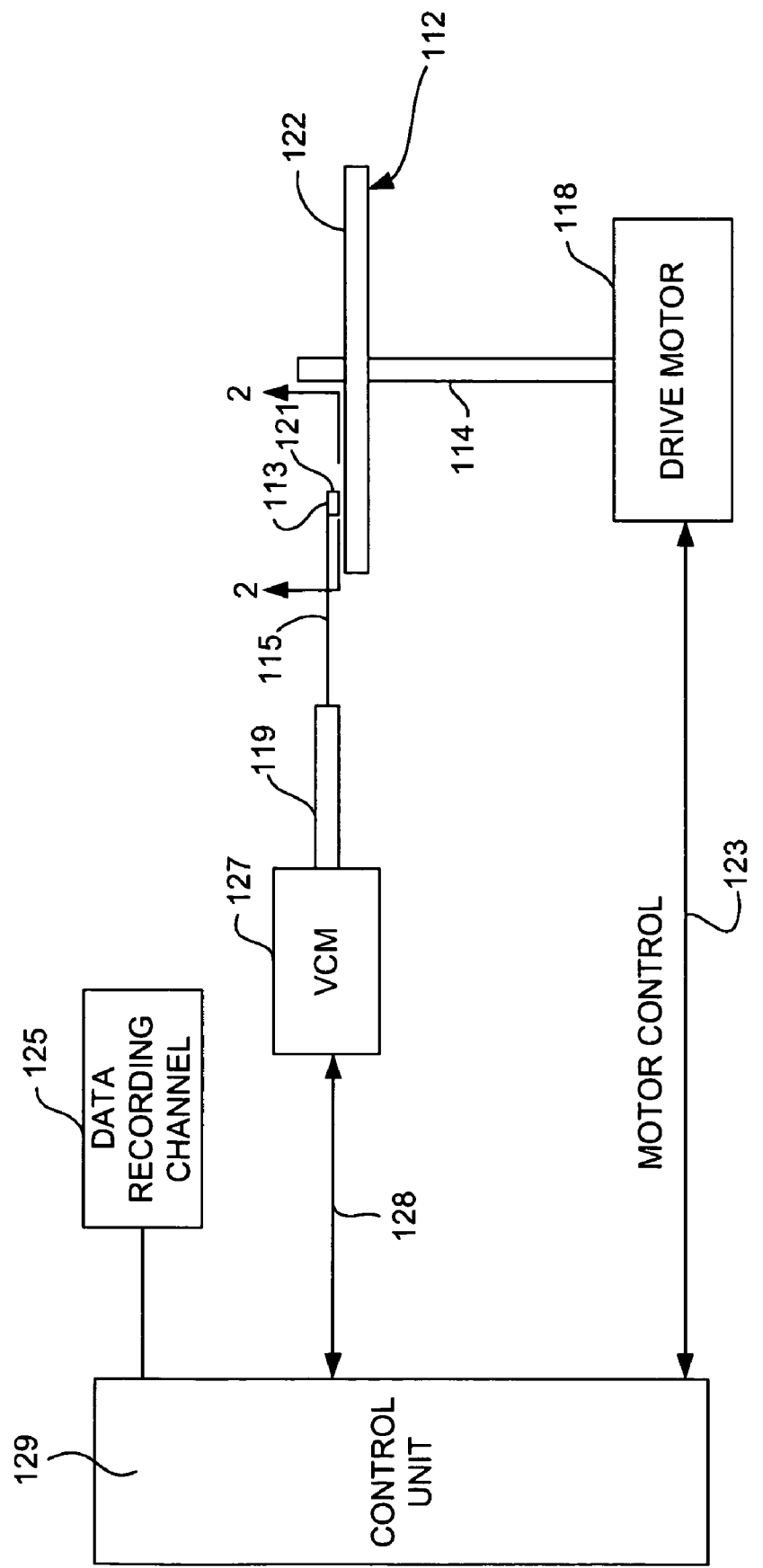
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
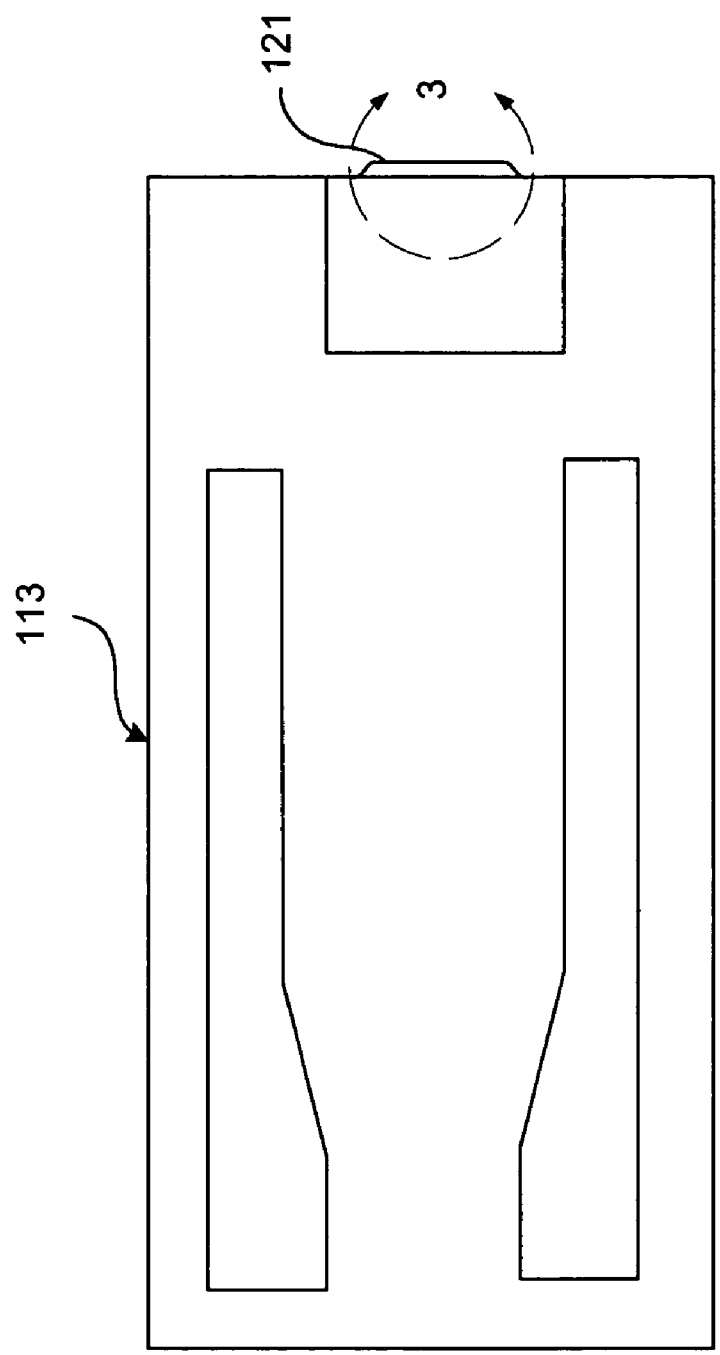
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
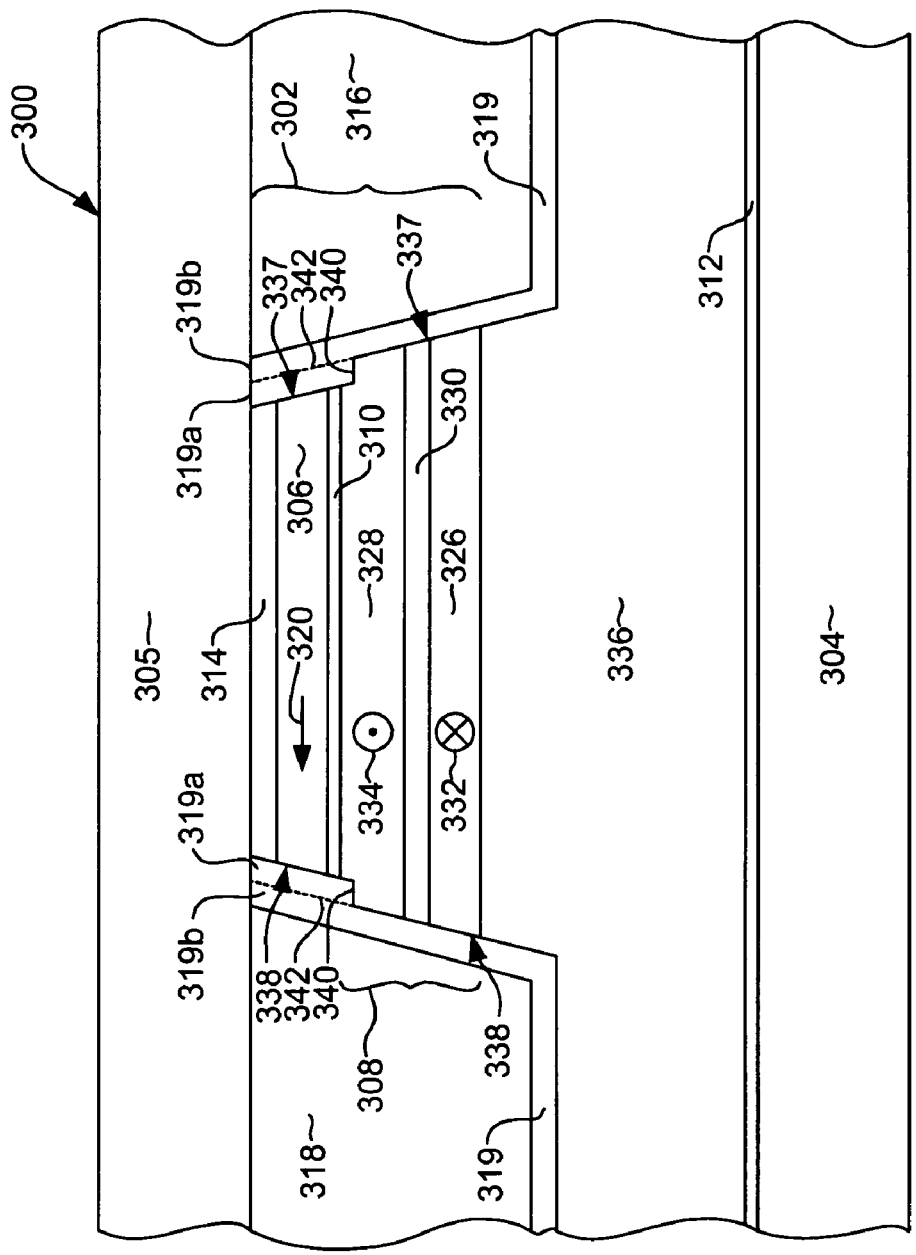
FIG. 3 is an enlarged ABS view taken from circle 3 of FIG. 2 and rotated 90 degrees counterclockwise.

With reference now to FIG. 3, a CPP magnetoresistive sensor 300 includes a sensor stack 302. The sensor 300 will be described in terms of a tunnel valve, but could also be embodied in a CPP GMR sensor or any other CPP sensor developed currently or in the future. The invention could even be embodied in a current in plane (CIP) sensor. The sensor stack 302 is sandwiched between first and second electrically conductive, magnetic shields 304, 305 which serve as both electrical leads and magnetic shields. The shields 304, 305 can be constructed of, for example, NiFe.

The sensor stack 302 includes a magnetic free layer 306, and a pinned layer structure 308. The free and pinned layers 306, 308 are separated from one another by a thin non-magnetic, electrically insulating barrier layer 310. The barrier layer can be constructed of, for example, alumina. Of course, as mentioned above, the invention could be embodied in a CPP GMR sensor, in which case the layer 310 would be an electrically conducive, non-magnetic spacer layer, such as Cu. A seed layer 312 may be provided at the bottom of the sensor to promote a desired grain growth in the sensor layers deposited thereon. In addition, a capping layer 314, such as Ta may be provided at the top of the sensor stack 302 to protect the sensor from damage, such as by corrosion, during manufacture.

With continued reference to FIG. 3, the pinned layer structure can be of several pinned layer designs, and is preferably an antiparallel coupled AFM pinned design. Therefore, the pinned layer structure 308 can include a first magnetic layer AP1 326, a second magnetic layer AP2 328 and an AP coupling layer 330 such as Ru sandwiched between the AP1 and AP2 layers 326, 328. The AP1 layer 326 is exchange coupled with a layer of antiferromagnetic material (AFM layer) 336, which strongly pins the magnetic moment 332 of the AP1 layer 326 in a desired direction perpendicular to the ABS. The antiparallel coupling between the AP1 and AP2 layers 326, 328 pins the magnetic moment 334 of the AP2 layer 328 in a direction antiparallel to the moment 332 of the AP1 layer 326. The AP1 and AP2 layers 326, 328 can be constructed of several magnetic materials and is preferably constructed of a material such as CoFe.

As can be seen in FIG. 3, the sensor stack 302 is described as a partial mill design in which the sides of the sensor stack extend down to a level within the AFM layer 336. However, the sensor 300 could also be a full mill design in which the sides of the sensor stack 300 extend down completely through the AFM layer 336. The construction of full mill and partial mill designs will be better understood by reading a method for constructing a sensor 300 as described herein below.

With reference still to FIG. 3, first and second hard bias layers 316, 318 are provided at either side of the sensor stack 302. The hard bias layers are separated from the sensor stack by insulation layers 319. The insulation layers 319 cover the sides of the sensor stack 302, and also extend over at least one of the shields 304, to prevent sense current from being shunted through the hard bias layer. The hard bias layers can be constructed of, for example CoPt or CoPtCr, and the insulation layers 319 can be constructed of, for example alumina.

The hard bias layers 316, 318 provide a bias field, which is magnetostatically coupled with the free layer to bias the magnetic moment 320 of the free layer in a desired direction parallel with the ABS, while leaving it free to rotate in response to a magnetic field from a magnetic medium. The free layer can be constructed of several magnetic materials, and is preferably constructed of Co, CoFe, NiFe or a combination of these materials.

With further reference to FIG. 3, it can be seen that the sensor stack 302 has first and second sides 337, 338, that are each formed with a step or notch 340. The step 340 defines a division between a relatively narrower portion of the sensor above the step and a relatively wider portion below the step. The step or notch 340 is a result of a novel manufacturing process that prevents the formation of redep (and resulting electrical shorting) at the side edges of the barrier layer 310 and also prevents damage to the barrier 310 and free layer 306 during removal or the redep. This step or notch 340 is preferably located at a level within or just beneath the barrier layer 310. In other words, the step 340 is preferably located at a level within, and preferably near the top, of the pinned layer structure 308, or within the barrier layer 310. The purpose of this step 340 and its beneficial location close to the barrier layer 310 will become apparent upon reading a method for constructing a sensor 300 according to an embodiment of the invention.

Another feature of the invention is that the insulation layers 319 at the sides 337, 338 of the sensor stack 302 are thicker above the step 340 than they are below the step 340. In fact, the portion of the insulation layer 319 above the step 340 actually consist of two layers of insulating material 319a, 319b having an interface 342 there between, indicated by a dashed line in FIG. 3. The insulation layers 319a, 319b may be constructed of, for example, alumina ($Al_2O_3$) or some other non-magnetic, electrically insulating material. The insulation layers 319a, 319b can be deposited by a conformal deposition method, as will be described in greater detail herein below. The interface 342 between the two insulation layers 319a, 319b is substantially aligned with the outer edge of the step 340. Since the layers 319a, 319b can be constructed of the same material (ie. alumina) the interface 342 between them may not be physically apparent. However it is also possible that different materials can be used for the insulation layers 319a, 319b, such as alumina for one layer and $SiO_2$ for the other layer.

Figure 4:
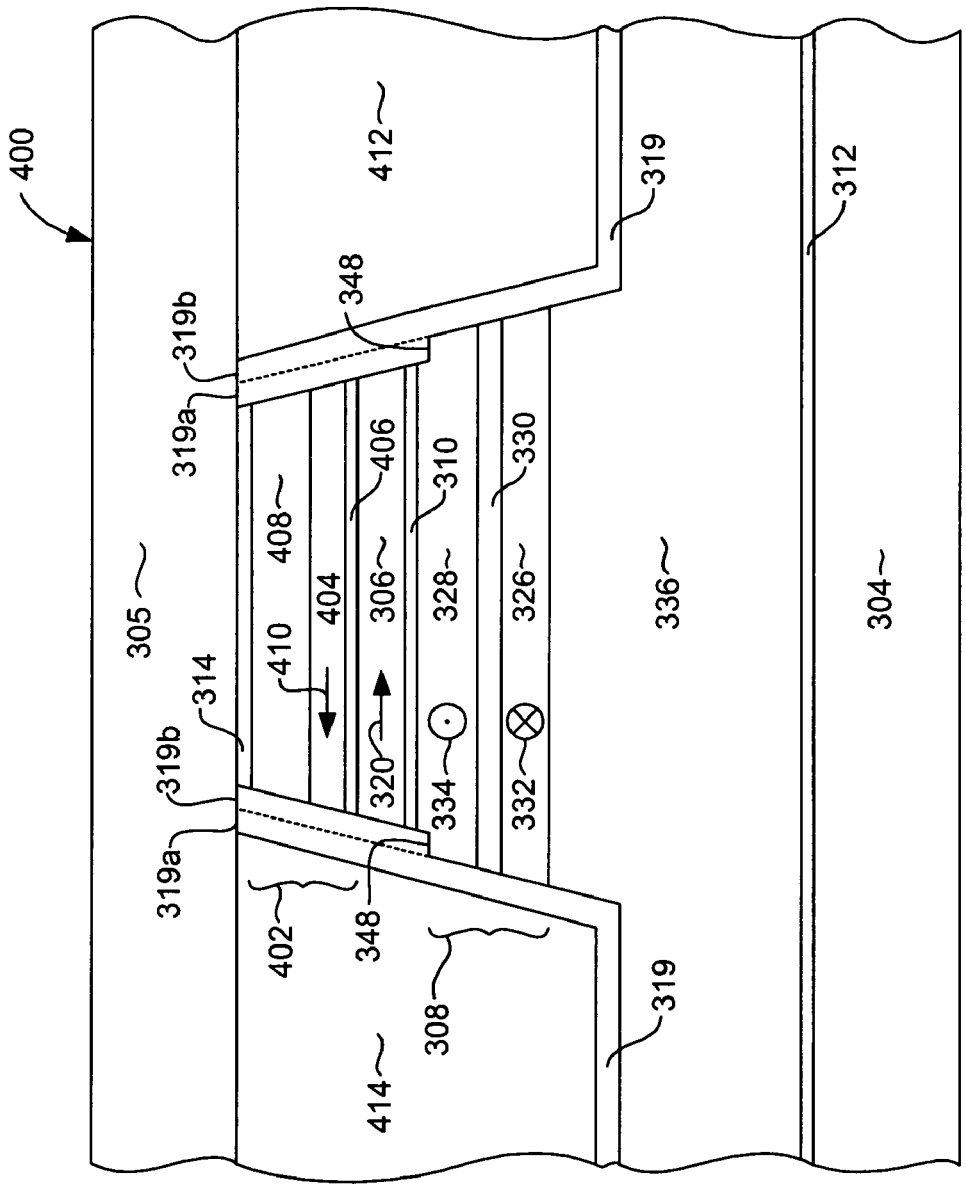
FIG. 4 is a view similar to that of FIG. 3 of an alternate embodiment of the invention.

With reference now to FIG. 4, the invention may be embodied in a sensor 400 having an in-stack bias structure 402, rather than the laterally disposed hard bias layers 316, 318 described with reference to FIG. 3. The in stack bias structure 402 may be one of many different possible structures, and preferably includes a bias layer 404 separated from the free layer 306 by a coupling layer 406. The bias layer 404 may be exchange coupled with a layer of antiferromagnetic material AFM layer 408. The bias layer 404 may be constructed of a high moment magnetic material such as CoFe or some other suitable material. The coupling layer can be constructed of a non-magnetic, electrically conductive material such as Ru, and is constructed of such a thickness to magnetostatically couple the magnetic moment 410 of the bias layer 408 with the moment 320 of the free layer 306.

The AFM layer 408 can be for example PtMn or IrMn and can be the same or a different material than that of the AFM layer 336 used to pin the pinned layer. Making the AFM layer 408 of a different material than the AFM layer 336 will facilitate setting the different AFM layers in orthogonal directions, because the difference in blocking temperatures between the two materials can be used to set the one AFM without affecting the other.

If an in stack bias structure 402 is used to bias the free layer 406, first and second magnetic side shields 412, 414 can be provided at either side of the sensor stack. These shields 412, 414 can be, for example NiFe or some other magnetic material.

Alternatively, an electrically insulating material such as alumina can be provided at either side of the sensor stack to provide additional protection against sense shunting between the leads/shields 304, 305.

Figure 5:
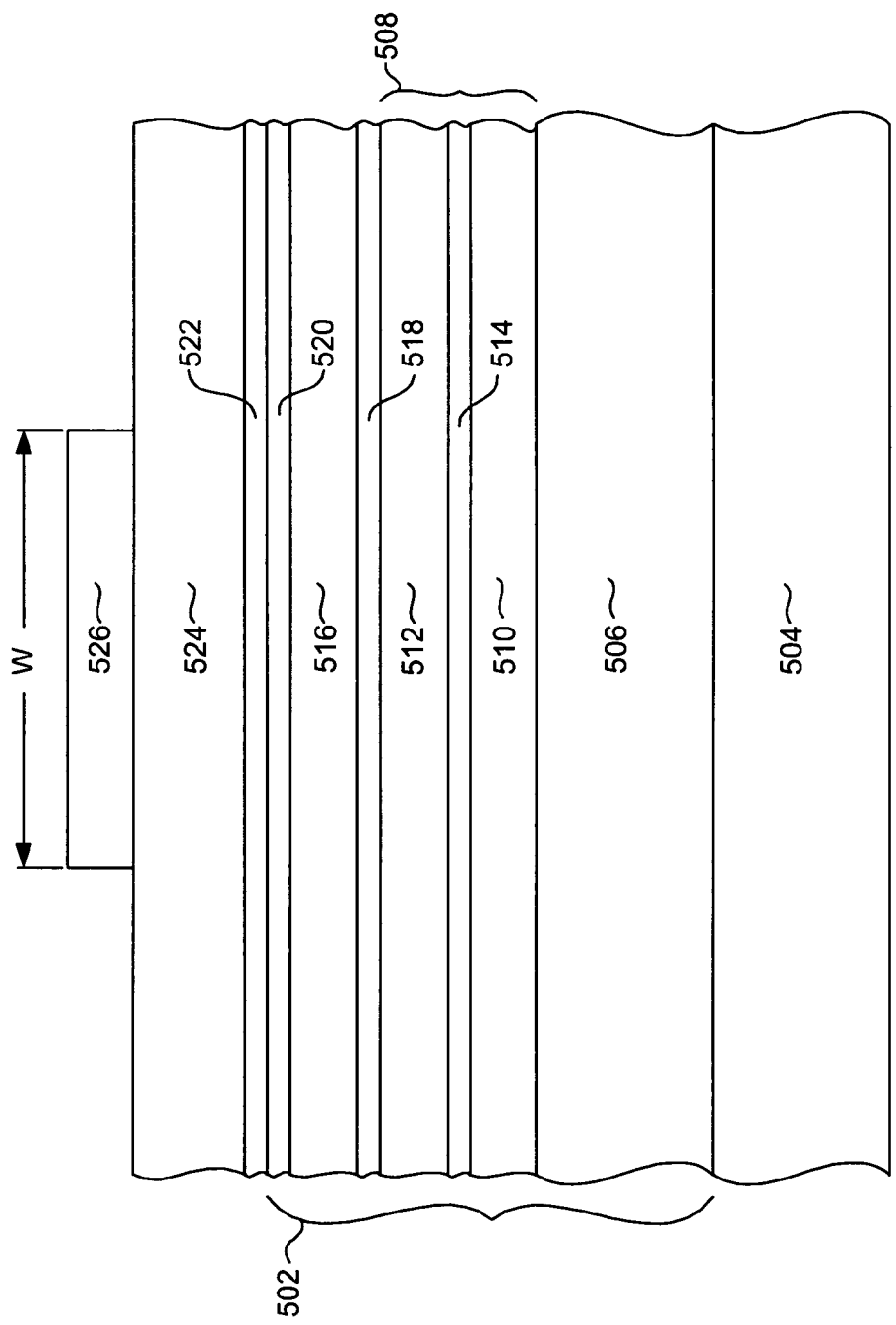
FIGS. 5-12 are ABS views of a magnetoresistive sensor in various intermediate stages of manufacture, illustrating a method of manufacturing a sensor according to an embodiment the invention.

With reference now to FIGS. 5-12, a method for constructing a sensor according to an embodiment of the invention is described. With particular reference to FIG. 5, a plurality of sensor layers 502 is deposited onto an underlying layer such as an electrically conductive lead layer 504. It should be understood that these various layers are formed and processed on a wafer such as a titanium carbide wafer in various wafer process tools such as sputter deposition chambers, ion mill tools and reactive ion etch tools.

The sensor layers 502 may include a layer of antiferromagnetic material (AFM layer) 506, a pinned layer structure 508 including AP1 and AP2 layers 510, 512 separated by an AP coupling layer 514. The sensor layers also include a free layer 516, separated from the pinned layer structure 508 by a tunnel barrier layer 518 such as alumina. If the sensor is to be a current perpendicular to plane CPP sensor, then the layer 518 would be an electrically conductive, non-magnetic material such as Cu. The sensor layers 502 may also include a capping layer 520 such as Ta, formed as a top layer to prevent damage to the sensor layers during manufacture. The AFM layer 506 may be, for example, PtMn, IrMn or some other antiferromagnetic material. The AP1 and AP2 layers, may be constructed of several magnetic materials, and are preferably constructed of CoFe. The coupling layer 514 is preferably constructed of Ru. The free layer may be constructed of several materials and is preferably constructed of Co, CoFe, NiFe or a combination of these materials. As mentioned above, the barrier layer 518 may be constructed of alumina.

With continued reference to FIG. 5 a first CMP stop layer 522 can be deposited on top of the sensor layers 502. The first CMP stop layer 522 can be, for example, diamond like carbon (DLC), and protects the sensor layers 502 during a subsequent chemical mechanical polishing process. An image transfer mask layer 524 such as DURAMIDE® may be deposited over the CMP stop layer 522 and sensor layers 502. A photosensitive mask 526 such as a photoresist mask is formed over the image transfer mask layer 524, CMP stop 522 and sensor layers 502. The photo mask 526 is photolithographically patterned to define the track width of the sensor. It should be pointed out that, while the process described herein is described in terms of defining the track width of the sensor, a similar, separate process would be performed to define the stripe height of the sensor (distance from the ABS to the back edge of the sensor).

Figure 6:
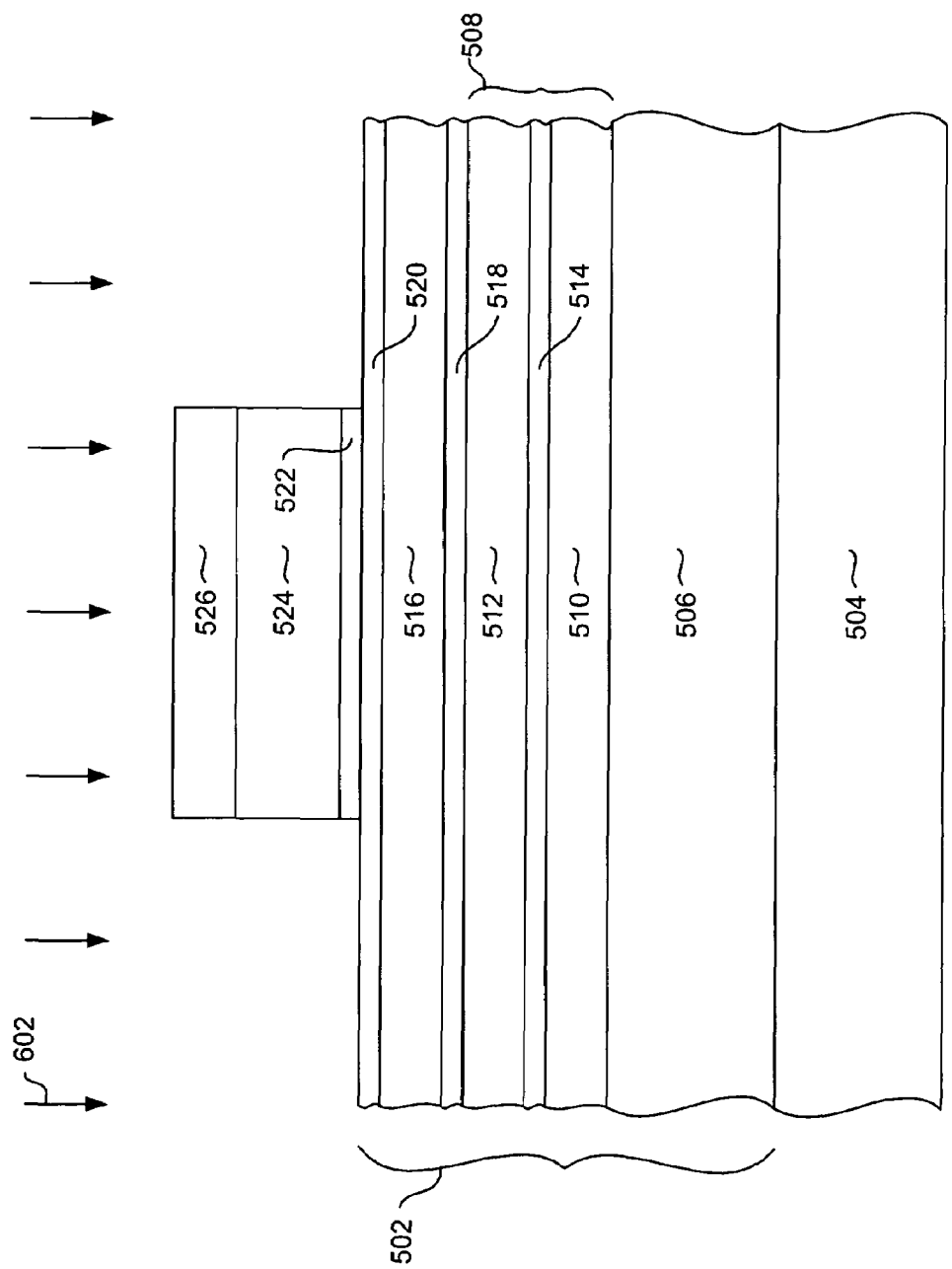

With reference now to FIG. 6, a reactive ion etch (RIE) 602 is performed to transfer the image of the photo mask 526 onto the underlying image transfer layer 524 and CMP stop layer 522. The image of the photo mask 526 is transferred onto these underlying layers 524, 522 by removing portions of the image transfer layer 524 and CMP stop layer 522 that are not protected by the photo mask layer 526.

Figure 7A:
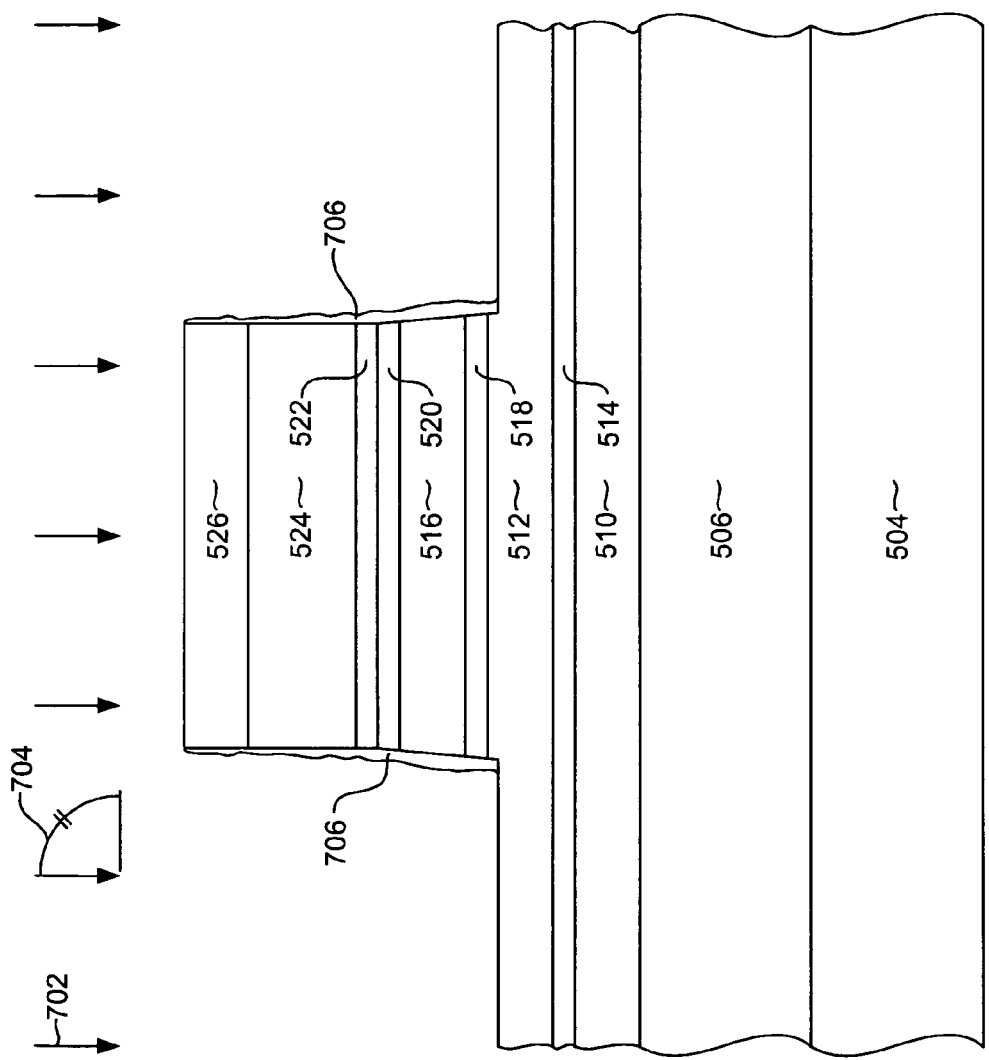

Then, with reference to FIG. 7A, a first ion mill 702 is performed. This first ion mill is performed at an angle 704 that is oblique or nearly oblique relative to the layers 502-526. More specifically this first ion mill is preferably performed at and angle of 70°-90° degrees with respect to the planes defined by the surfaces of the deposited layers 502-526. This first ion mill is preferably performed just sufficiently to remove selected portions of the sensor material 502 not covered by the masks 524, 526 down to a level within or just beneath the barrier layer 518 (or spacer layer in the case of a CPP GMR sensor). In other words, the first ion mill 702 is performed until the barrier 518 is just exposed, or down to a level near the top of the pinned layer structure 508. Preferably an end point scheme such as optical emission or secondary ion mass spectroscopy will be used to accurately control this milling process.

Figure 7B:
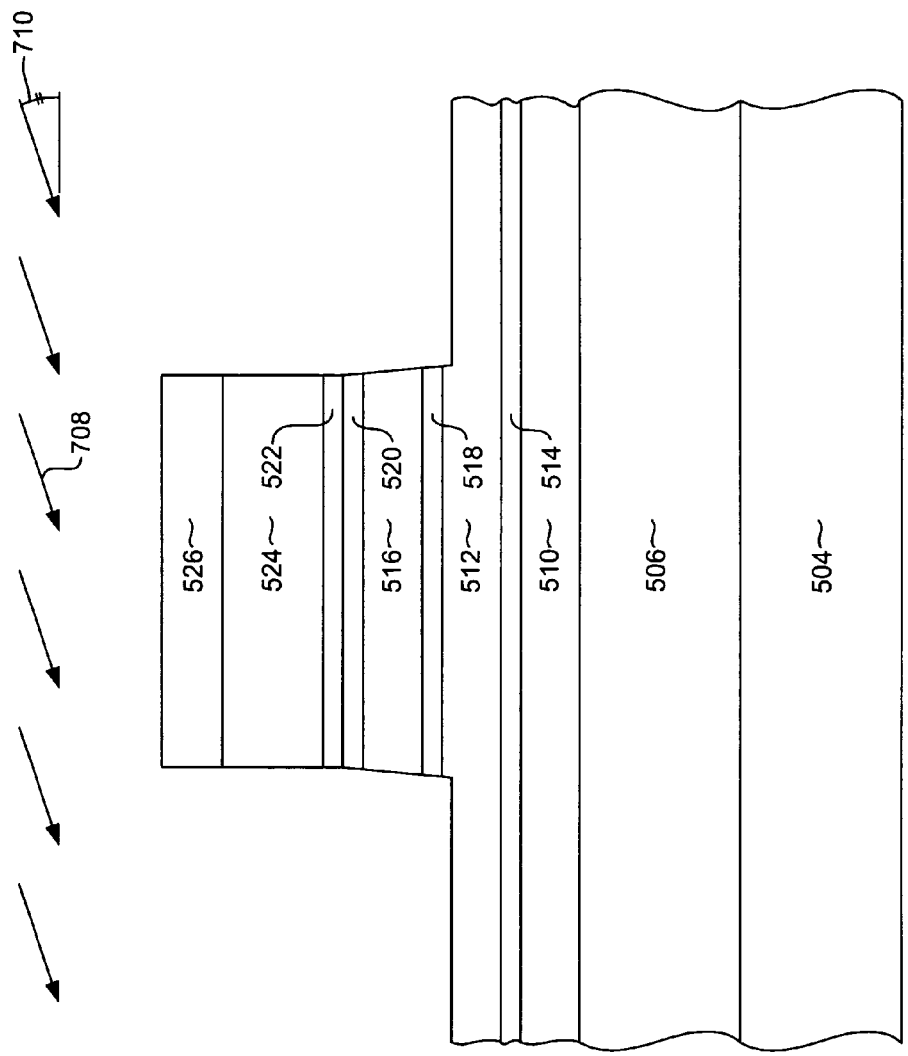

As can be seen with reference to 7A, the first ion mill 702 results in a small amount of re-deposited material (redep) 706 being formed on the side walls of the removed portions of the sensor layers 502. However, because only the cap layer 520, free layer 516 and barrier 518 have been milled, the amount of redep is very small as compared with the amount that would be produced by milling the whole sensor. With reference now to FIG. 7B, a second ion mill 708 can be performed to remove the small amount of redep from the sides of the barrier 518, free layer 516 and cap 520. This second ion mill 708 can be performed preferably at a glancing angle 710 of 0-40° with respect to the planes defined by the layers of the sensor. Because the amount of redep produced by the first ion mill is so small, it can be easily removed by a quick ion mill with negligible damage to the sides of the barrier 518, and free layer 516. In order to reduce damage to the sensor, this second ion mill can be performed at a relatively low beam voltage, down to ~100V. The first and second ion mills are performed while the wafer is held on a rotating chuck in order to ensure an even ion mill effect.

Figure 8:
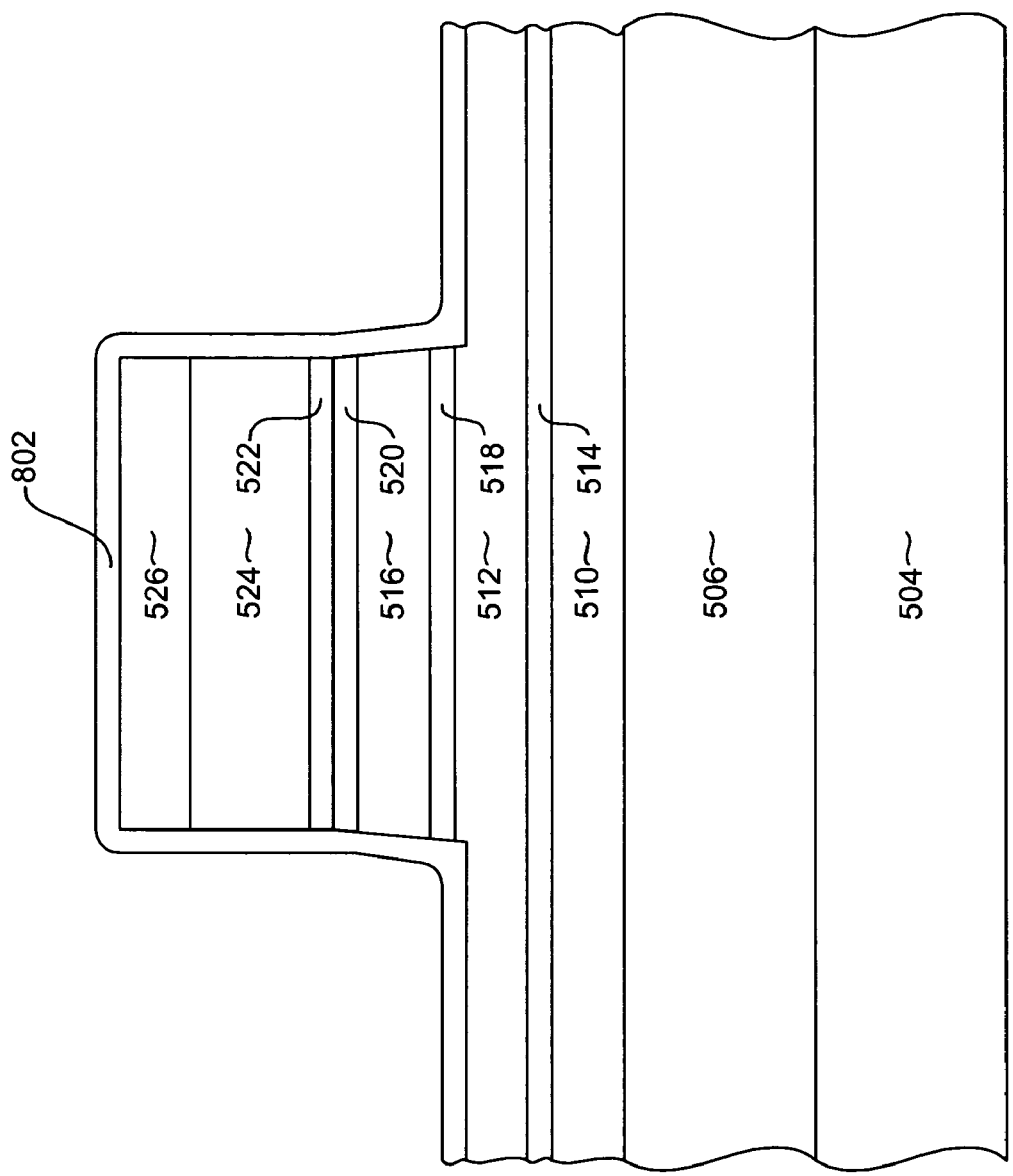

With reference now to FIG. 8, an insulation layer 802 is deposited. The insulation layer 802 can be constructed of a non-magnetic, electrically insulating material such as alumina ($Al_2O_3$). The insulation layer 802 can be deposited preferably by a conformal deposition process such as chemical vapor deposition (CVD) or atomic layer deposition (ALD), or by a process such as physical vapor deposition (PVD) or ion beam deposition (IBD).

Figure 9A:
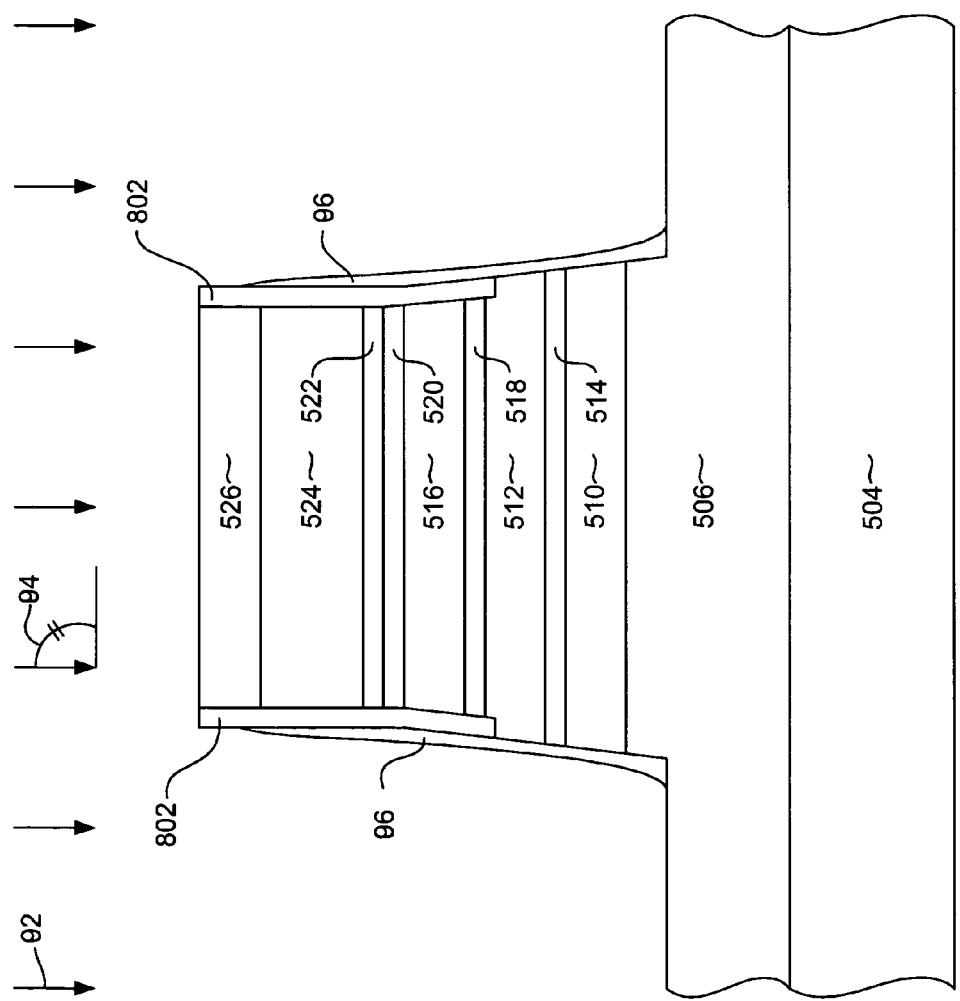

Then, with reference to FIG. 9A, a third ion mill 902 is performed to complete the definition of the sensor track width. The third ion mill 902 is performed at an oblique or nearly oblique angle with respect to the sensor layers in a manner similar to the first ion mill 702. Therefore, the third ion mill 902 is preferably performed at an angle 904 of 60°-90° with respect to the surfaces of the sensor layers. The third ion mill 902 removes the horizontally disposed portions of the insulation layer 802, leaving the vertically disposed portions remaining on the sides of the sensor layers. It can be seen that this third ion mill 902 also results in a certain amount of redep 906. However, this redep 906 does not contact the sides of the barrier layer 518 and free layer 516, because they are protected by the insulation layer 802.

Figure 9B:
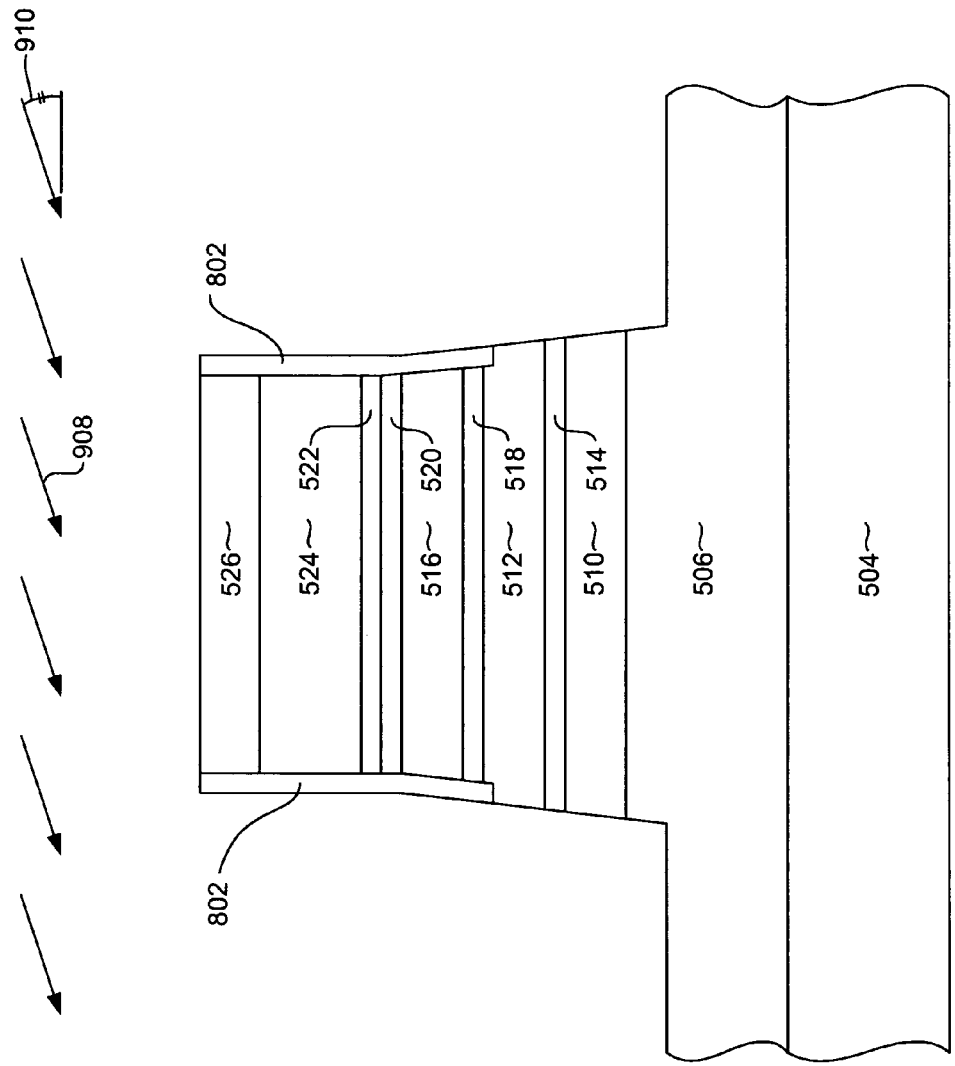

With reference to FIG. 9B, a fourth ion mill 908 can be performed to remove the redep 906 from the sides of the sensor. This fourth ion 908 mill is similar to the second ion mill 708, and can be performed at an angle 910 of 0-40° degrees with respect to the sensor layers. This fourth ion mill 908 removes the redep 906 from the sides of the sensor. However, the fourth ion mill 908 does not affect the edges of the barrier layer 518 or free layer 416 at all, because these layers are protected by the insulation layer 802. Whereas prior ion mill redep removal processes would have caused damage to the sensor layers, such as by interlayer diffusion between the barrier layer and adjacent free and pinned layers, the present invention avoids such damage by protecting these layers with the insulation layer 802. The insulation layer also prevents shunting across the barrier layer by preventing the redep from accumulating at the sides of the barrier layer 518.

Figure 10:
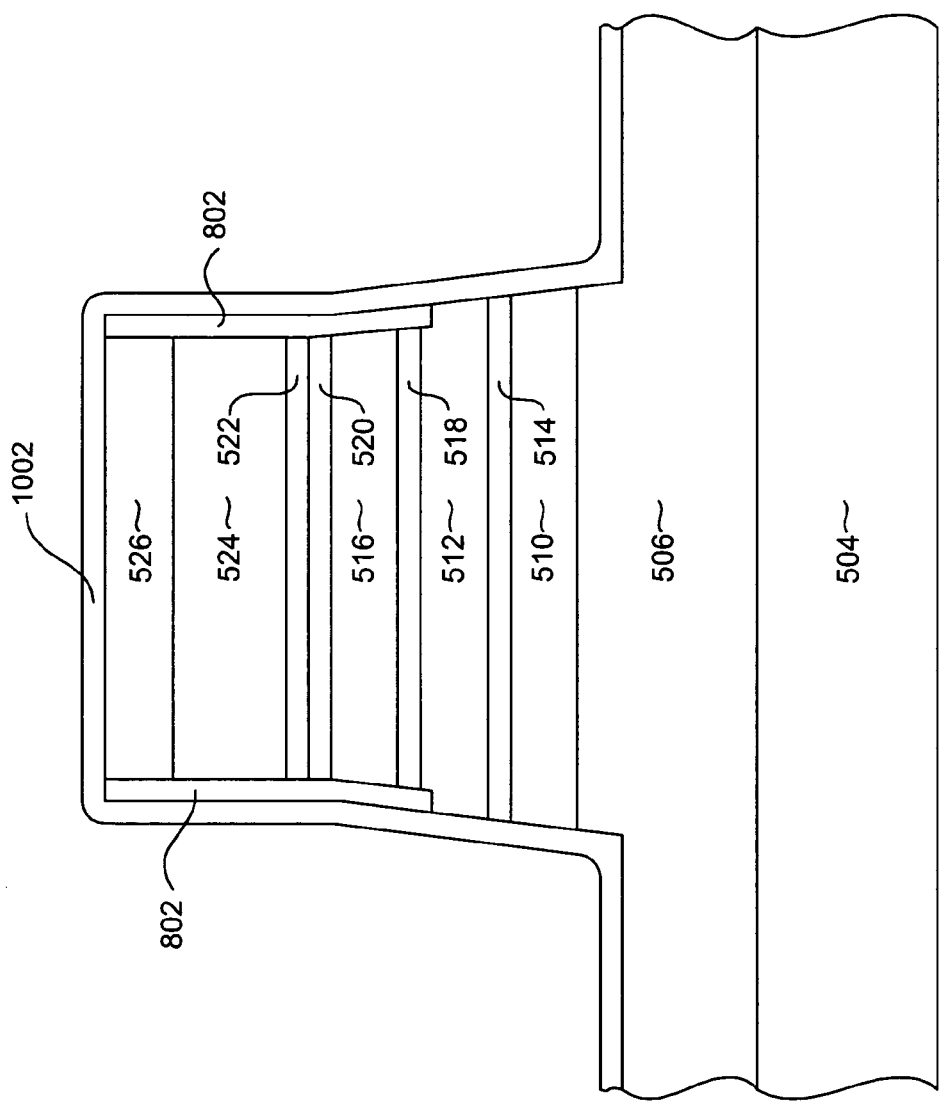

With reference now to FIG. 10, a second layer of insulation 1002 is deposited full film. This second insulation layer 1002 can be the same material as that of the first insulation layer 802, or can be a completely different material. For example, the second insulation layer can be constructed of a non-magnetic, electrically insulating material such as alumina, or $SiO_2$, and can be deposited by a deposition process such as chemical vapor deposition, atomic layer deposition or physical vapor deposition.

Figure 11:
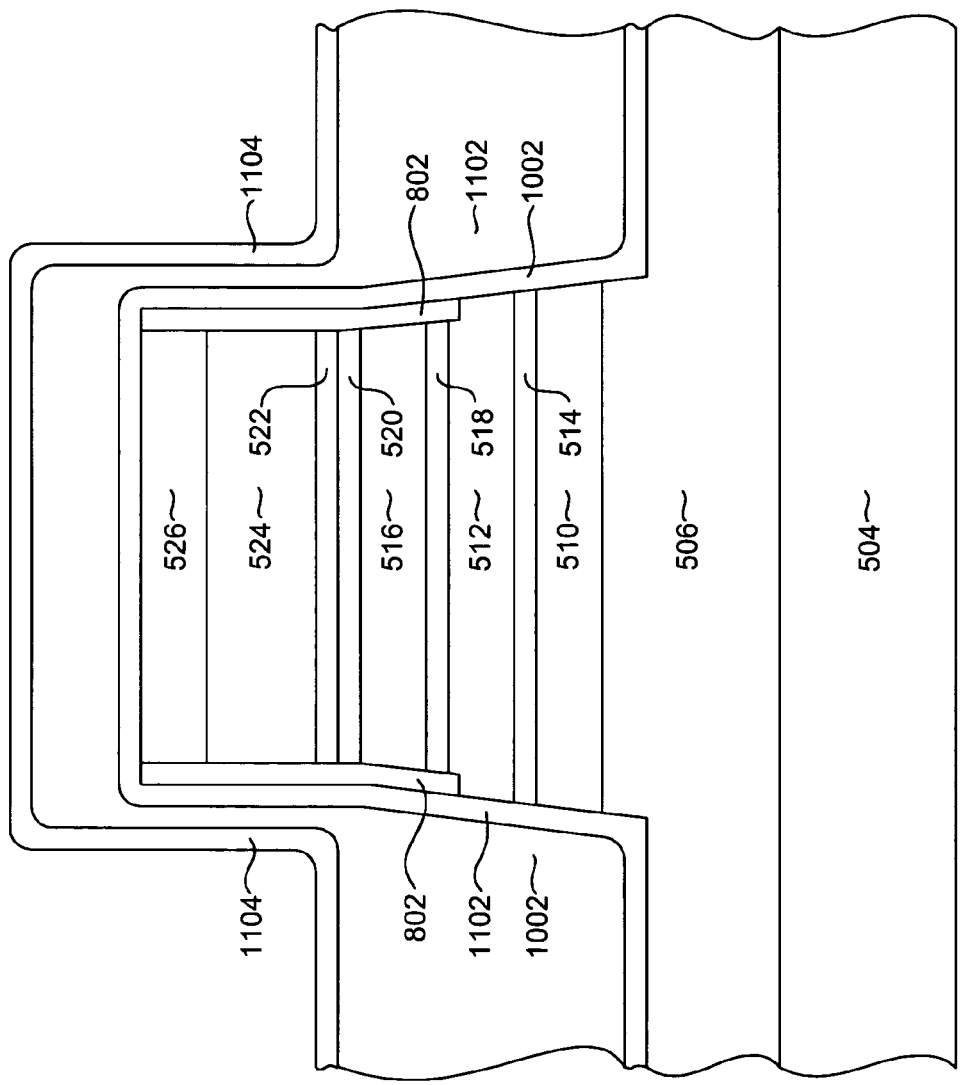
Figure 12:
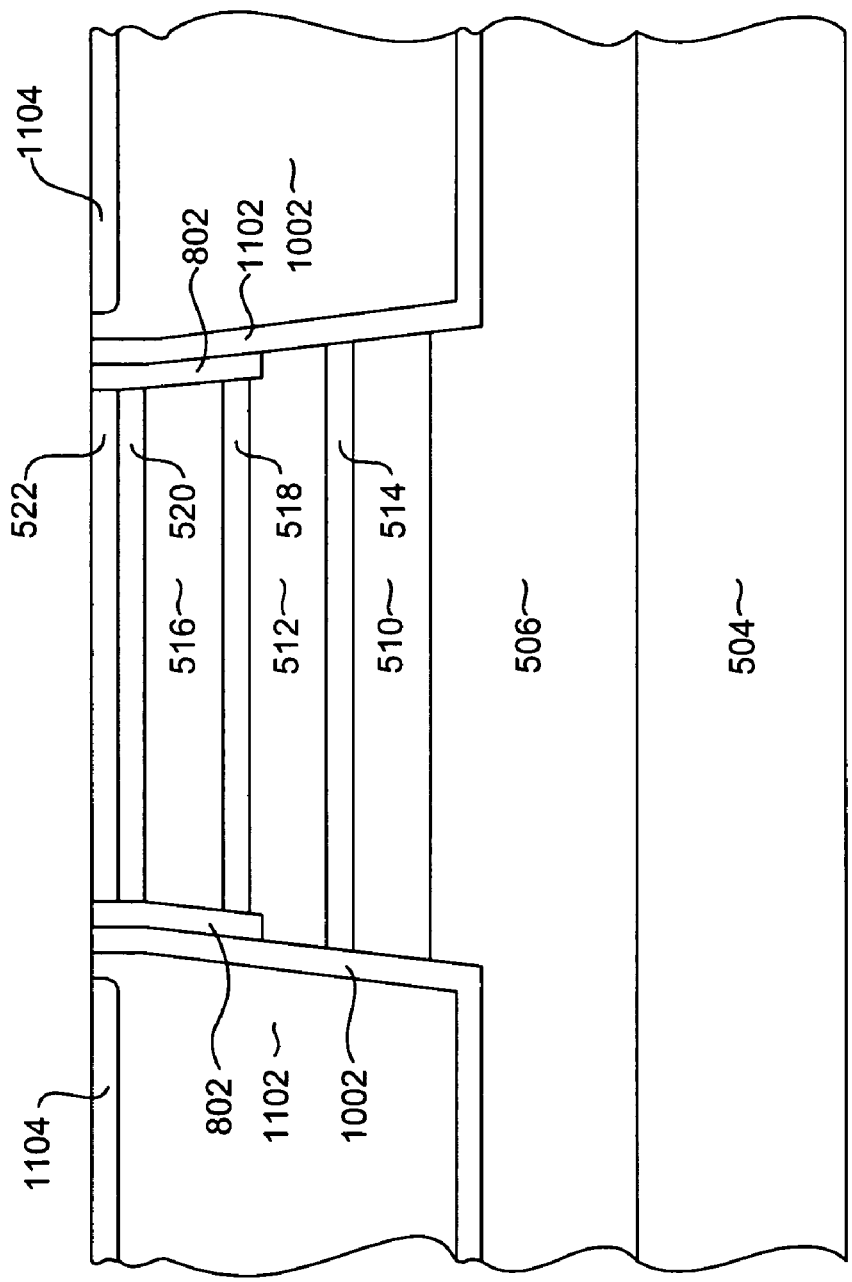

Then, with reference to FIG. 11, a layer of hard magnetic material 1102 can be deposited full film. The hard magnetic material layer 1102 can be, for example, CoPt or CoPtCr, and provides the hard bias layers 316, 318 for biasing the magnetic moment of the free layer 306 (FIG. 3). The hard bias layer can further comprise of a seed layer and a capping layer. A layer of material that is resistant to chemical mechanical polishing (second CMP stop layer) 1104 can then be deposited full film. The second CMP stop layer 1104 can be constructed of, for example, diamond like carbon (DLC).

It should be pointed out that although the process for constructing a magnetoresistive sensor, is being described in terms of constructing a CPP sensor having hard bias layers disposed laterally at the sides of the sensor, the process could also be used to construct a sensor having an in stack bias structure, in which case the hard magnetic material 1102 could be replaced with an electrically insulating material such as alumina or could be replaced with a magnetic side shield materials such as NiFe.

A chemical mechanical polish, CMP can be performed to remove material extending above the first and second CMP stop layers 522, 1104. The CMP, therefore, removes the mask layers 526, 524 (FIG. 11) and the portions of layers 1102, 1104 that extend up over the mask layers 526, 225, resulting in a structure illustrated with reference to FIG. 12. Then the CMP stop layers 1102, 1104 are removed with a technique such as reactive ion etching. Thereafter, a second shield material can be deposited, resulting in the structure illustrated with reference to FIG. 3.

It should be pointed out that, while the above process description describes a method for defining the track width of a sensor, a similar process would be followed to define the stripe height of the sensor. The process used to define the stripe height of the sensor would involve constructing a mask, milling to just past the barrier layer, removing the small amount of redep from the back edge of the free layer and barrier layer, depositing a first insulation layer and performing another ion mill to define the rest of the back edge (stripe height) of the sensor.

It should also be pointed out that, while the invention has been described in terms of constructing a CPP sensor such as a tunnel valve, or a CPP GMR, the invention could also be embodied in a current in plane GMR sensor for the stripe height definition process. In addition, while the invention has been described in terms of a sensor having a free layer formed above (after) the pinned layer structure, the pinned layer could be at the top.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresitive sensor, comprising:
   a sensor stack having a pinned layer structure, a free layer and a non-magnetic layer sandwiched between the pinned and free layers, the sensor stack having first and second laterally opposed sides each configured with a step having an outer edge; and
   an insulation layer formed at each of the first and second sides of the sensor;
   wherein the step formed in the side edge defines a division between a relatively wider portion below the step and a relatively narrower portion above the step, and wherein the insulation layer at the relatively narrower portion comprises two layers of insulating material and the insulation layer at the relatively wider portion comprises a single layer of insulation, and wherein an interface between the two layers of insulating material is substantially aligned with the out edge of each step.

2. A magnetoresistive sensor as in claim 1 wherein the step defines a division between a relatively wider portion below the step and a relatively narrower portion above the step, and wherein the insulation layer formed at side edge of the sensor is thicker at the relatively narrower portion than at the relatively wider portion.

3. A sensor as in claim 1 wherein the two layers of insulation at the relatively narrower portion comprise two layers of the same material.

4. A sensor as in claim 1 wherein the two layers of insulation at the relatively narrower portion comprise two layers of alumina.

5. A sensor as in claim 1 wherein the non-magnetic layer of the sensor stack is disposed within the relatively narrower portion of the sensor stack.

6. A sensor as in claim 1 wherein the non-magnetic layer is an electrically conductive spacer layer.

7. A sensor as in claim 1 wherein the free layer is formed above the pinned layer, and wherein the step is formed below the free layer and within the non-magnetic layer.

8. A sensor as in claim 1 the free layer is formed above the pinned layer and wherein the step is beneath the free layer and the barrier layer, and within the pinned layer.

9. A sensor as in claim 1 further comprising a layer of antiferromagnetic material (AFM layer) formed beneath the pinned layer, and wherein:

the free layer is formed above the pinned layer;

the step is formed between the bottom of the free layer and the bottom of the pinned layer structure.

10. A sensor as in claim 1 wherein the sensor stack is sandwiched between first and second electrically conductive leads and the sensor is a current perpendicular to plane (CPP) sensor.

11. A magnetoresitive sensor, comprising:

a sensor stack having a pinned layer structure, a free layer and a non-magnetic layer sandwiched between the pinned and free layers, the sensor stack having a side edge configured with a step having an outer edge, the step defining a narrow region above the step and a wider region below the step; and an insulation layer formed at the side edge of the sensor, the insulation layer comprising two layers of insulating material at the narrow region and a single layer of insulating material at the wider region, and wherein the outer edge of the step is substantially aligned with an interface between the two layers of insulating material; and wherein the two layers of insulation at the relatively narrower portion comprise two layers of different insulating materials.

12. A magnetoresitive sensor, comprising:

A sensor stack having a pinned layer structure, a free layer and a non-magnetic layer sandwiched between the pinned and free layers, the sensor stack having a side edge configured with a step having an outer edge, the step defining a narrow region above the step and a wider region below the step; and an insulation layer formed at the side edge of the sensor, the insulation layer comprising two layers of insulating material in the narrow region and a single layer of insulating material in the wider region;

wherein the two layers of insulation at the relatively narrower portion comprise a layer of alumina and a layer of $SiO_2$.

13. A magnetoresistive sensor, comprising:

a free layer structure; and a pinned layer structure;

wherein the sensor stack has an air bearing surface and has a relatively wider portion, a relatively narrower portion and a notch extending in direction parallel with the air bearing surface defining the junction between the relatively wider portion and the relatively narrower portion, the free layer structure being disposed within the relatively narrower portion and at least a portion of the pinned layer structure being disposed within the relatively wider portion; and two layers of insulating material formed at a side of the sensor stack in the relatively narrow portion and only a single layer of insulting material formed at a side of the sensor stack in the relatively wider portion, the two layers of insulating material defining an interface therebetween that is substantially aligned with an out edge of the notch.

14. A sensor as in claim 13 wherein the sensor includes first and second laterally opposed side walls, the width being defined by the distance between the laterally opposed side walls.

* * * * *

UNITED STATES PATENT AND TRADEMARK OFFICE
CERTIFICATE OF CORRECTION

PATENT NO. : 7,639,456 B2  Page 1 of 1
APPLICATION NO. : 11/246720
DATED : December 29, 2009
INVENTOR(S) : Ying Hong et al.

It is certified that error appears in the above-identified patent and that said Letters Patent is hereby corrected as shown below:

In claim 10, column 11, line 4, please replace "claim I" with --claim 1--.

Signed and Sealed this

Fifteenth Day of June, 2010

David J. Kappos
*Director of the United States Patent and Trademark Office*